United States Patent
Burleson et al.

(10) Patent No.: US 9,706,659 B2
(45) Date of Patent: Jul. 11, 2017

(54) ATTACHMENT DEVICE

(71) Applicant: Intel Corporation, Santa Clara, CA (US)

(72) Inventors: Grace Burleson, Beaverton, OR (US); Brian Sackerman, Portland, OR (US); Sarah Canny, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 340 days.

(21) Appl. No.: 14/570,490

(22) Filed: Dec. 15, 2014

(65) Prior Publication Data
US 2016/0169259 A1 Jun. 16, 2016

(51) Int. Cl.
F16B 19/00 (2006.01)
H05K 1/18 (2006.01)
F16B 5/06 (2006.01)
F16B 21/08 (2006.01)

(52) U.S. Cl.
CPC ............ H05K 1/18 (2013.01); F16B 5/0642 (2013.01); F16B 21/086 (2013.01)

(58) Field of Classification Search
CPC ...... H05K 1/18; F16B 15/0642; F16B 21/086
USPC ................................. 411/508–510
See application file for complete search history.

(56) References Cited

U.S. PATENT DOCUMENTS

| 4,074,888 | A | * | 2/1978 | Garner | ................. A47G 1/1606 248/475.1 |
| 5,186,591 | A | * | 2/1993 | Malks | ..................... F16B 35/02 411/301 |
| 5,624,130 | A | * | 4/1997 | Ricks | ................. B60R 21/2035 24/453 |
| 6,545,879 | B1 | * | 4/2003 | Goodwin | ............. H05K 7/1053 361/688 |
| 6,557,675 | B2 | * | 5/2003 | Iannuzzelli | ........... F16F 7/1028 188/380 |
| 6,611,431 | B1 | * | 8/2003 | Lee | ..................... H01L 23/4006 257/719 |
| 6,752,577 | B2 | * | 6/2004 | Chen | ........................ G06F 1/20 165/80.3 |
| 8,083,038 | B2 | * | 12/2011 | Reisel | ..................... F16F 1/128 188/300 |
| 8,934,247 | B2 | * | 1/2015 | Chen | ........................ H01L 23/40 165/80.3 |
| 2003/0210951 | A1 | * | 11/2003 | Alden, III | ............. F16B 35/041 403/230 |
| 2006/0275100 | A1 | * | 12/2006 | Aukzemas | ............ F16B 37/145 411/353 |

(Continued)

Primary Examiner — Gary Estremsky
(74) Attorney, Agent, or Firm — Schwegman Lundberg & Woessner, P.A.

(57) ABSTRACT

Generally discussed herein are systems, apparatuses, and methods that relate to an attachment device. According to an example, a device may include an elongated shaft including a top portion, a central portion, and a bottom portion, the central portion between the top portion and the bottom portion, a first fastener in the bottom portion of the shaft, a second fastener in the top portion of the shaft, the second fastener having an adjustable fastening location along the top portion of the shaft, and a spring situated between the first fastener and the second fastener such that a spring force of the spring varies depending on a selected fastening location on the second fastener.

19 Claims, 8 Drawing Sheets

(56) References Cited

U.S. PATENT DOCUMENTS

2008/0130238 A1* 6/2008 Yang ................... F16B 19/1081
361/719
2015/0139755 A1* 5/2015 Lu ........................ F16B 19/004
411/510

* cited by examiner

ATTACHMENT DEVICE

TECHNICAL FIELD

Embodiments in this disclosure generally relate to an attachment device. One or more embodiments include a device that may provide a variety of compression characteristics.

BACKGROUND

Electrical, electronic, or other components may be mechanically coupled to a printed circuit board (PCB) in a variety of ways. Many components, such as a resistor, transistor, capacitor, or a die may be mechanically coupled using solder or a wire bond. Other components may be mechanically coupled by one or more screws or a plastic connector, depending on the technology or component to be. The performance of these components is generally not sensitive to an amount of force used to attach the component to the PCB. A component that is sensitive to an amount of force used to attach it to a PCB generally requires a different attachment mechanism, such as to provide the proper amount of force. However, the present attachment mechanisms for these sensitive components are generally designed for use with one component under specific use conditions and the attachment mechanisms may need to be redesigned for use in a new set of conditions.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Embodiments in this disclosure relate generally to an attachment device that may help provide a variety of compression forces.

Methods, systems, or devices in accord with this disclosure may help in attaching a heat sink or other component to a structure, such as PCB or other structure. The methods, systems, or devices may provide a single mechanism that provides a variety of compression forces. The methods, systems, or devices may be used with a component whose performance is sensitive to a compression force applied thereto.

Figure 1:
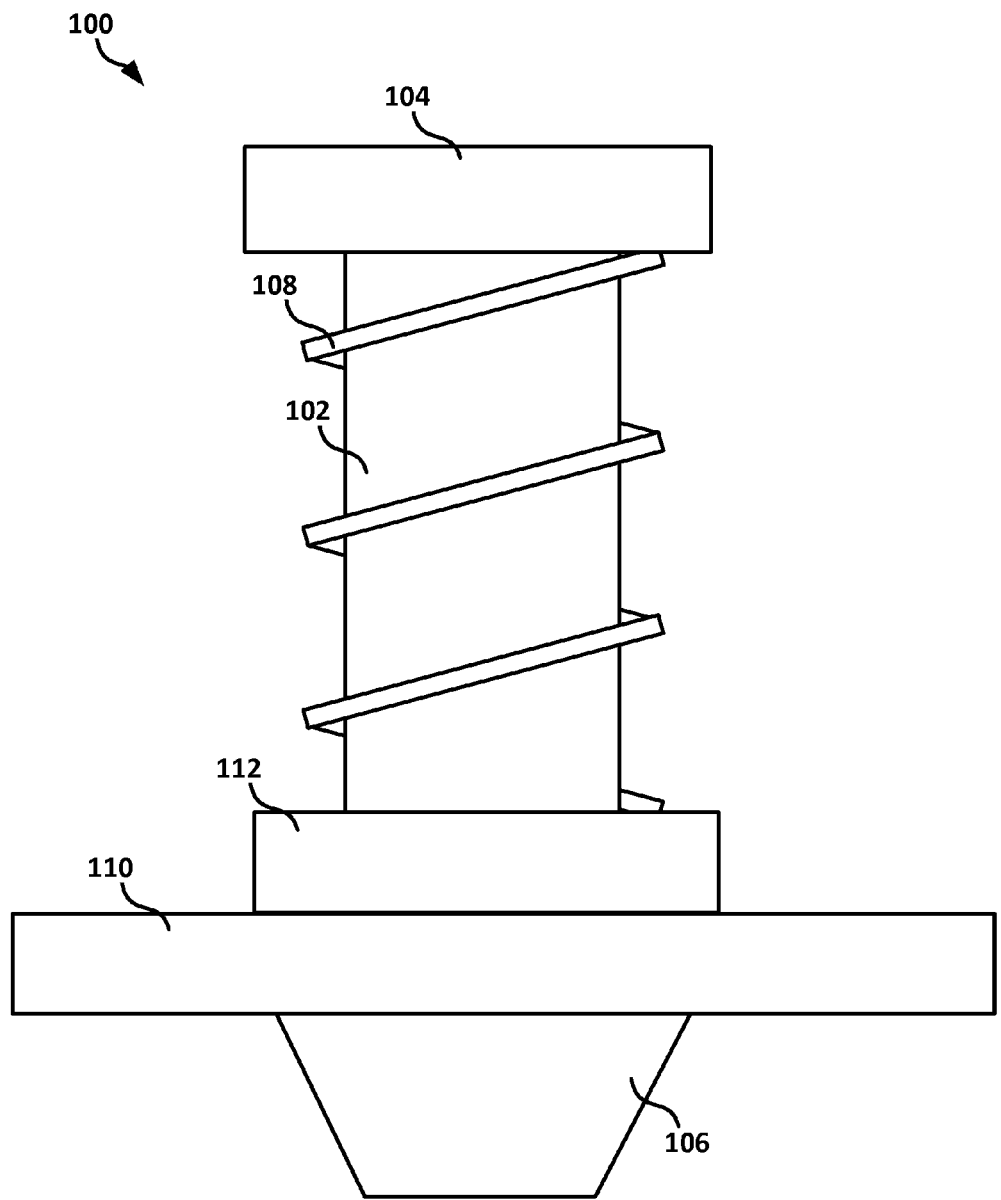
FIG. 1 illustrates a perspective view diagram of an attachment system.

FIG. 1 shows a perspective view diagram of an attachment system 100. The system 100 includes a pin with a shaft 102 that has a cap 104 mechanically coupled thereto at a first end of the shaft 102 and a barb projection 106 mechanically coupled thereto at an opposite second end of the shaft 102. The pin and a spring 108 are typically used for pressing a component 112 onto a board 110 (e.g., a PCB) or other structure. The pin is typically made from Nylon. The pin is generally inserted through a hole in the board 110 (the hole is not visible in the perspective view of FIG. 1).

The spring 108 is situated around the shaft 102 of the pin and contacts a cap 104 of the pin. A compression force created by compressing the spring 108 between the cap 104 and the component 112 on the board 110 secures the pin into position and presses the component onto the board 110. The cap 104 is generally manufactured at a specific height from the component 112, board 110, or barb projection 106, so as to compress the spring 108 and provide a specific force on the component 112.

An incorrect amount of force on the component 112 may cause a problem. If the compression force is too strong, the component 112 may be damaged. If the compression force is too weak, the component 112 may not be securely mechanically coupled to the board 110 or may not be in sufficient contact with another component on the board 110 (the other component is not shown in FIG. 1, but would generally be situated between the board 110 and the component 112).

In an instance in which the component 112 is a heat sink and the force is too weak, a thermal connection between the heat sink and an associated component from which the heat sink is to dissipate heat may be weak. In such an instance the heat sink may not transfer enough heat away from the other component and the component may overheat.

A problem associated with these sorts of capped pins, is that these capped pins may be redesigned and manufactured for each new design, because the position of the cap 104, and thus the compression force created by the spring 108, is generally not adjustable. This redesign time adds cost per design and lengthens time to market (TTM).

Figure 2:
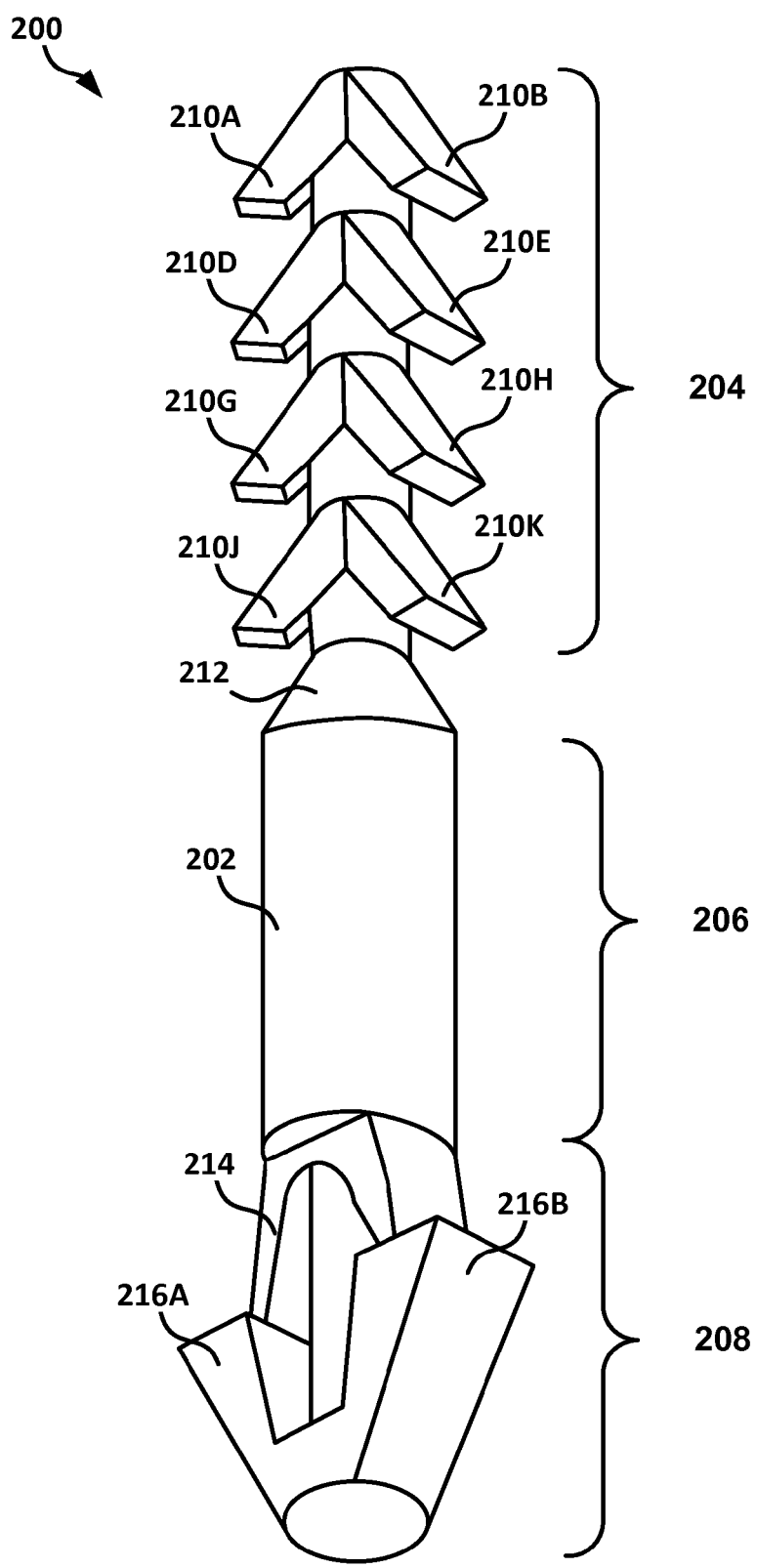
FIG. 2 illustrates, by way of example, a perspective view diagram of an embodiment of an attachment device.

FIG. 2 illustrates, by way of example, an embodiment of an attachment device 200. The device 200 may include an elongated shaft 202 and a plurality of fastening mechanisms 210A, 210B, 210C, 210D, 210E, 210F, 210G, 210H, 210I, 210J, 210K, 210L, and/or 216A and 216B. The fastening mechanisms 210C, 210F, 210I, and 210L are not shown in the perspective view of FIG. 2, but are visible in the perspective view of FIG. 3.

The shaft 202 may include a top portion 204, a central portion 206 and a bottom portion 208. The central portion 206 may be mechanically coupled to the top portion 204 at a first end of the central portion 206 and to the bottom portion 208 at a second, opposite end of the central portion 206.

The shaft 202 may be made of a variety of materials including polymer, such as plastic or Nylon, ceramic, metal, wood, or a combination thereof. The shaft 202 may be rectangular, circular, triangular, or other polygonal or elliptical shape in a cross-section perpendicular to the length of the shaft 202. The shaft 202 may be a variety of lengths. In one or more embodiments, the shaft 202 may be between about one half of an inch and about three quarters of an inch in length. In other embodiments, the shaft 202 may be shorter than one half of an inch. In other embodiments, the shaft 202 may be longer, such as inches, tens of inches, or one or more feet in length.

The top portion 204 may include a plurality of fastening mechanisms 210A-L coupled to the shaft 202 and protruding (e.g., radially) therefrom. Each of the fastening mechanisms 210A-L may be angled away from the shaft 202 from the top portion 204 towards to the central portion 206, such that the distance between the fastening mechanism 210A-L and the shaft 202 is greater in a portion of the fastening mechanism 210A-L that is closer to the central portion, such as shown in FIG. 2. The fastening mechanisms 210A-L and 216A-B as shown in FIG. 2 are barb projections. However, other fastening mechanisms may be used, such as a threaded shaft that provides a securing means for a threaded washer. While a threaded shaft and washer approach may provide a finer granularity of compression forces, the barb projections may be implemented with simpler tooling. A "barb projection" as used herein is an object that is mechanically coupled to the shaft, extends out from the shaft, and is angled away from the shaft, thus making it difficult to extract an item, such as a PCB, component, or other object, therefrom in one direction. The barb projection may or may not be pointed.

The fastening mechanisms 210A-L may be mechanically coupled to the shaft 202 at various locations along the shaft 202. In the example of device 200, a first group of fastening mechanisms including the fastening mechanisms 210A, 210B, and 210C (210C not shown in FIG. 2, see FIG. 3) is mechanically coupled to the top portion near a top end of the shaft 202. A second group of fastening mechanisms including the fastening mechanisms 210D, 210E, and 210F (210F not shown in FIG. 2, see FIG. 3) is mechanically coupled to the top portion 204 closer to the central portion 206 than the first group of fastening mechanisms. A third group of fastening mechanisms including the fastening mechanisms 210G, 210H, and 210I (210I not shown in FIG. 2, see FIG. 3) is mechanically coupled to the top portion 204 closer to the central portion 206 than the second group of fastening mechanisms. A fourth group of fastening mechanisms including the fastening mechanisms 210J, 210K, and 210L (210L not shown in FIG. 2, see FIG. 3) is mechanically coupled to the top portion 204 closer to the central portion 206 than the third group of fastening mechanisms.

The fastening mechanisms 210A-210L may be made of a polymer, such as Nylon, a rubber, or a plastic, a metal, or other semi-flexible or semi-deformable material. The fastening mechanisms 210A-210L may be flexible such that a force applied to an outer surface of the fastening mechanism 210A-210L may reduce a distance between an end of the fastening mechanism 210A-210L and the shaft 202. This flexibility may provide the ability to press an object, such as a washer 500 (see FIG. 5), that includes an inner width 504 greater than the width of the top portion 204 of the shaft 202 but less than the length 706 between the shaft 202 and the outer edge of the fastening mechanism 210A-L (see FIGS. 5 and 7 for the dimensions) over the first, second, third, or fourth group of fastening mechanisms. The fastening mechanisms in each group may be spaced about the shaft 202, such as to be equally spaced about the shaft 202.

In one or more embodiments, the fastening mechanisms in the first group of fastening mechanisms may be situated directly over (i.e. in line with) or may be staggered or offset from the fastening mechanisms in the second group of fastening mechanisms. Similarly, the second group of fastening mechanisms may be situated directly over (i.e. in line with) or may be staggered or offset from the fastening mechanisms in the third group of fastening mechanisms, and so on.

Each group of fastening mechanisms may include two or more fastening mechanisms. In one or more embodiments, the fastening mechanism 210A-L may be mechanically coupled to a stabilizing structure, such as a structure similar to the stabilizing structure 214 that helps the fastening mechanism regain its shape after it is flexed.

The fastening mechanisms 210A-I may be removable, such as by breaking the shaft 202 under the fastening mechanisms to be removed. For example, to remove the first group of fastening mechanisms (i.e. the fastening mechanisms 210A, 210B, and 210C), the shaft 202 may be cut or otherwise broken below a location where the first group of fastening mechanisms are mechanically coupled to the shaft 202.

The shaft 202 may be mechanically coupled to a frustum 212. The frustum 212 may include a first width at a first end and a second width that is greater than the first width at a second end. The first end of the frustum 212 may be mechanically coupled to the top portion 204. The first width of the frustum 212 may be substantially equal to a width 702 of the top portion 204 of the shaft 202. The second end of the frustum 212 may be mechanically coupled to the central portion 206 of the shaft 202. The second end of the frustum 212 may include a width substantially equal to the width 708 of the central portion 206 of the shaft 202. A "frustum" is generally an object that has a shape that is a portion of another shape, such as a pyramid or cone, that remains after the shape is cut by two parallel planes. The frustum shown in FIG. 2 is a conical frustum. A conical frustum has a circular base while a pyramidal frustum has a polygonal base, such as a triangular base, a square base, a pentagonal base, a hexagonal base, a heptagonal base, an octagonal base, etc. The frustum 212 may provide mechanical stability between the top portion 204 and the central portion 206 of the shaft 202, such as to help in resisting a rotational or shear force without breaking, bending, or otherwise damaging the shaft 202.

The bottom portion 208 of the shaft 202 may include a stabilizing structure 214 and a group of fastening mechanisms (e.g., the group of fastening mechanisms that includes the fastening mechanism 216A and 216B). Each fastening mechanism 216A-B may be angled away from the shaft 202 from the bottom portion 208 of the shaft 202 towards the central portion 206 of the shaft 202. The fastening mechanisms 216A-B may be made of a polymer, such as Nylon or a plastic, metal, or other semi-flexible or semi-deformable material.

The fastening mechanisms 216A-B may be flexible such that a force applied to an outer surface of the fastening mechanism 216A-B reduces a distance between the fastening mechanism 216A-B and the shaft 202. This flexibility may provide the ability to press the fastening mechanism 216A-B through an opening, such as a hole or void in a component, PCB, or other structure, that includes a width greater than the width of the shaft 202, but less than the distance between the center of the shaft 202 and the outer edge of the fastening mechanism 216A-B. The fastening mechanisms 216A-B may be spaced about the shaft 202, such as to be equally spaced about the shaft 202.

The fastening mechanisms 216A-B may make it difficult to extract an item over the fastening mechanisms in a first direction and the fastening mechanisms 210A-L may make it difficult to extract an item in a second direction opposite the first direction. Such a design makes it difficult to extract an item in any direction, thus trapping the item between the fastening mechanisms 210A-L and 216A-B.

The fastening mechanisms 216A-B may be mechanically coupled, such as to form a generally "U" shaped structure. The bottom portion 208 may terminate at the vertex of the "U". The shaft 202 may pass through the stabilizing structure 214. The stabilizing structure 214 may mechanically couple the fastening mechanisms 216A-B to the central portion 206 of the shaft. While FIG. 2 shows two or three fastening mechanisms in a group of fastening mechanisms, a group of fastening mechanisms may include more fastening mechanisms and each group of fastening mechanisms need not include the same number of fastening mechanisms.

The stabilizing structure 214 may include an arch that opens towards the fastening mechanisms 216A-B, such as shown in FIG. 2. The stabilizing structure 214 may be deformable, such as to allow the fastening mechanisms 216A-B to flex towards the shaft 202 or resist the fastening mechanisms 216A-B flexing away from the shaft 202. The stabilizing structure 214 may be made of a polymer, such as Nylon or a plastic, metal, or other semi-flexible or semi-deformable material. The stabilizing structure 214 may help the fastening mechanisms 216A-B regain their shape (i.e. unflex) after being flexed towards the shaft 202, thus providing mechanical stability to the fastening mechanisms 216A-B.

While the FIGS. show the stabilizing structure 214 as a single arch, the stabilizing structure 214 may include a plurality of arches, a slotted cylinder or open frustum (non-solid frustum), or other shape that may be deformable and provide stability to the fastening mechanisms 216A-B. The shape of the stabilizing structure 214 may be dependent on the shape and number of fastening mechanisms in the bottom portion 208 of the shaft 202.

Figure 3:
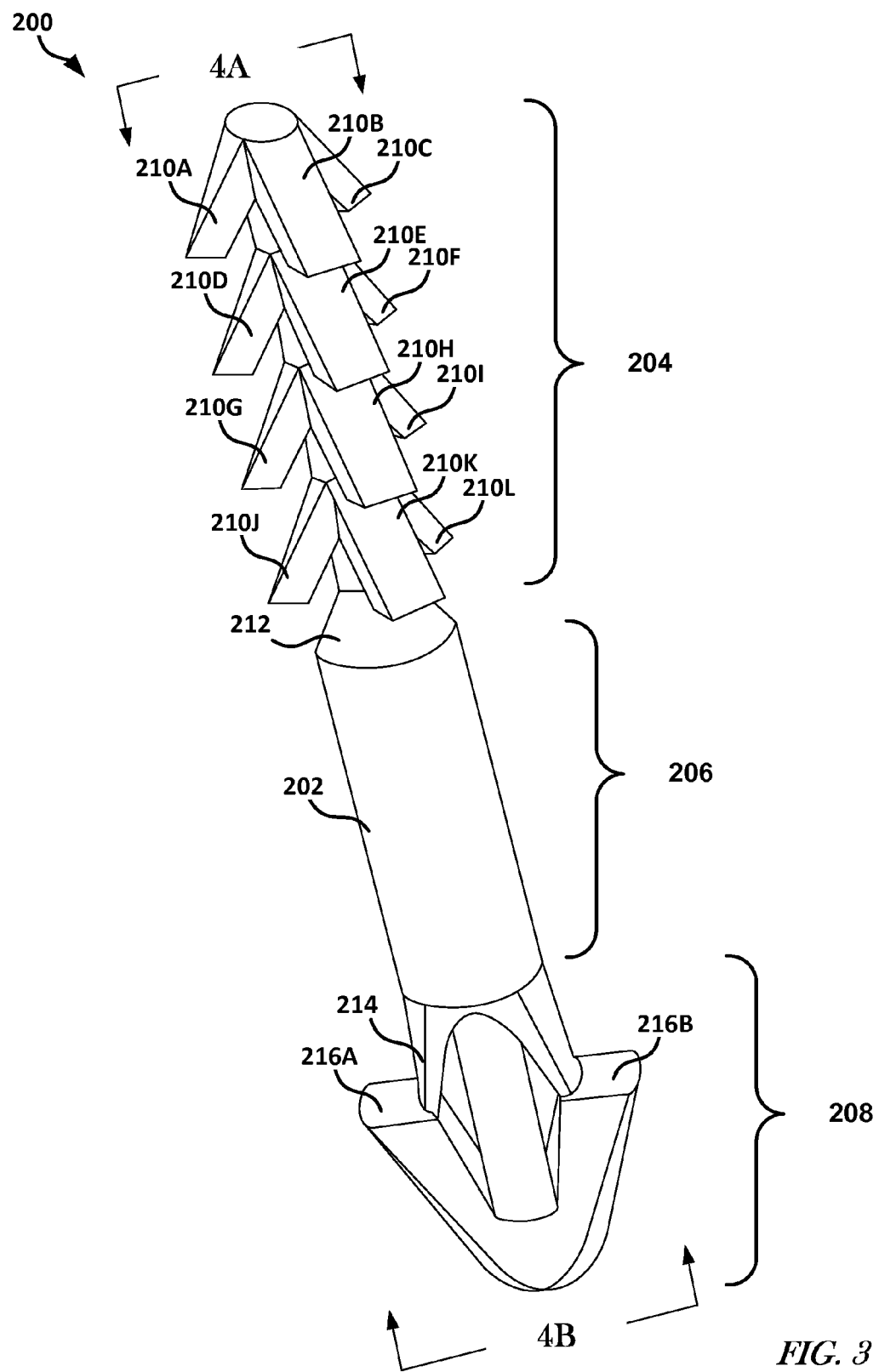
FIG. 3 illustrates, by way of example, another perspective view diagram of the attachment device of FIG. 2.

FIG. 3 illustrates, by way of example, another perspective view diagram of the embodiment of the attachment device 200 shown in FIG. 2. The device 200 of FIG. 3 shows that each group of fastening mechanisms in the top portion 204 of the shaft 202 includes three fastening mechanisms, in the example of device 200. In the example of device 200, the first group of fastening mechanisms includes the fastening mechanisms 210A, 210B, and 210C; the second group of fastening mechanisms includes the fastening mechanisms 210D, 210E, and 210F; the third group of fastening mechanisms includes the fastening mechanisms 210G, 210H, and 210I; and the fourth group of fastening mechanisms includes the fastening mechanisms 210J, 210K, and 210L.

Figure 4A:
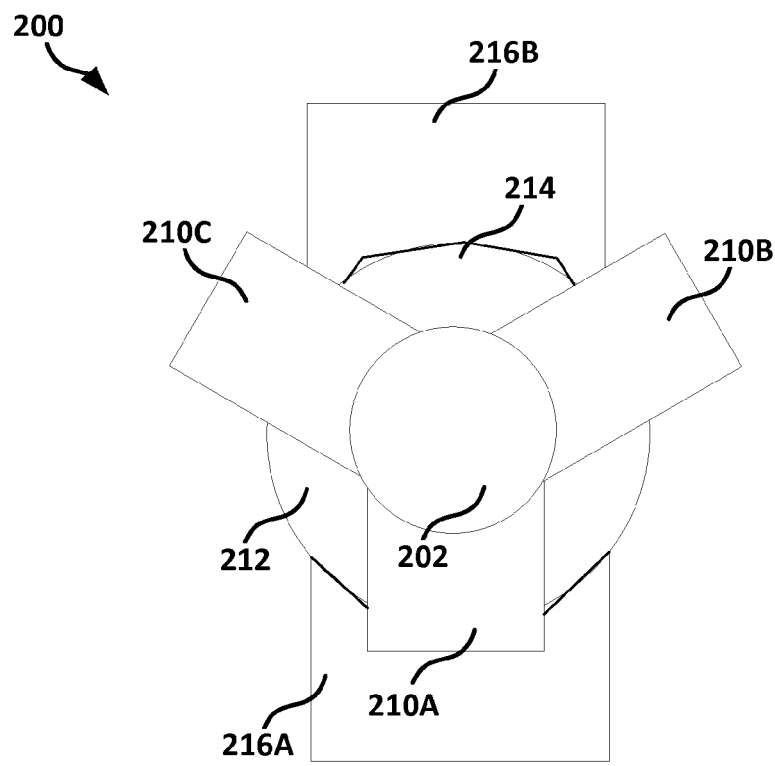
FIG. 4A illustrates, by way of example, a perspective view diagram of the attachment device of FIG. 3 viewed from the arrows labeled "4A".
Figure 4B:
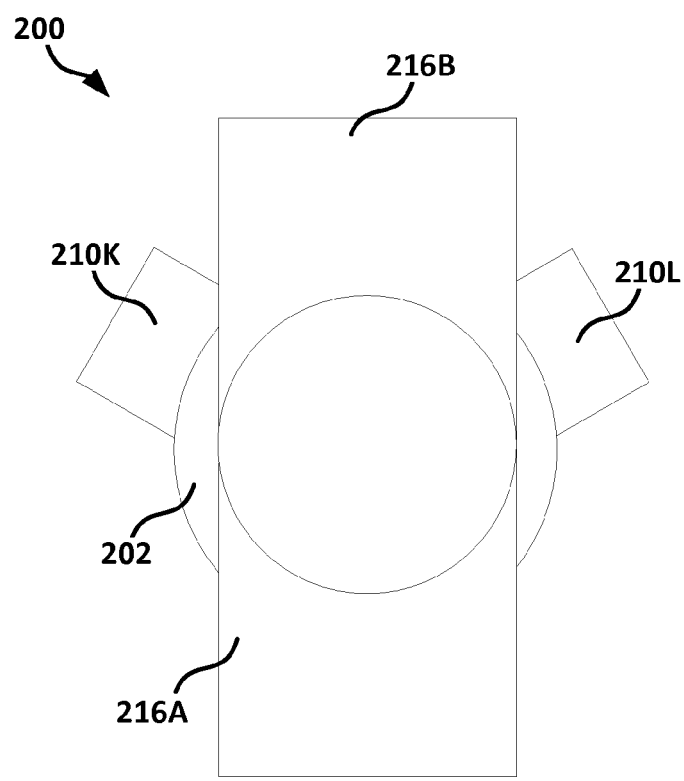
FIG. 4B illustrates, by way of example, a perspective view diagram of the example attachment device of FIG. 3 viewed from the arrows labeled "4B".

FIG. 4A illustrates, by way of example, a perspective view diagram of the device 200 in the direction of the arrows labeled "4A" in FIG. 3. FIG. 4B illustrates, by way of example, a perspective view diagram of the device 200 in the direction of the arrows labeled "4B" in FIG. 3.

Figure 5:
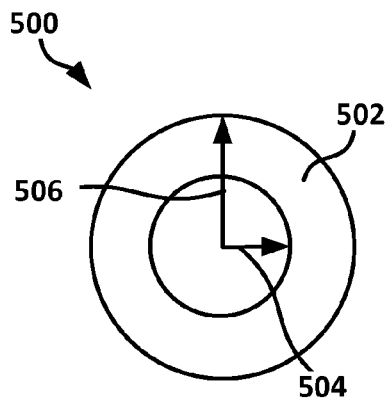
FIG. 5 illustrates, by way of example, a perspective view diagram of an embodiment of a washer.

FIG. 5 illustrates, by way of example, a perspective view diagram of an embodiment of a washer 500. The washer 500 may include an annulus 502 or other shaped solid portion, that includes an inner width 504 (e.g., radius) and an outer width 506 (e.g., radius). The annulus 502 may be made of a flexible material, such as nylon, rubber, or other flexible polymer. The annulus 502 may be made of a less flexible material, such as ceramic, metal, wood, or other material. In an embodiment in which the annulus 502 is less flexible, a stabilizing structure may be mechanically coupled between the shaft 202 and one or more of the fastening mechanisms 210A-L to help the fastening mechanism regain their shape after being flexed toward the shaft 202. The washer 500 may be a generally flat washer or a frustum-like (slight conical shape) washer.

Figure 6:
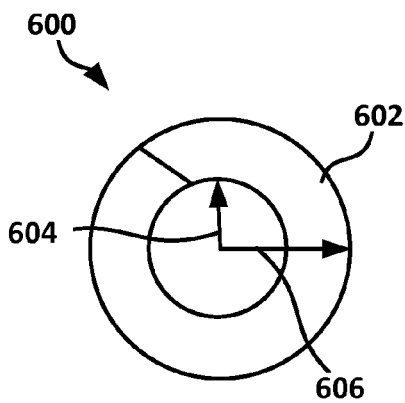
FIG. 6 illustrates, by way of example, a perspective view diagram of an embodiment of a spring.

FIG. 6 illustrates, by way of example, a perspective view diagram of an embodiment of a spring 600. The spring 600 may include a wound portion 602, an inner width 604 (e.g., radius), and an outer width 606 (e.g., radius). The spring 600 may be a compression-type spring that pushes back against a load, thus providing a compression force when the load is placed on the spring 600. The spring 600 may include a cylindrical shape, a conical shape, an hourglass (convex) shape, or a barrel (concave) shape, for example. The ends of the spring 600 may be reduced so as to have a smaller inner width than the remainder of the spring 600.

The spring 600 may be made of a polymer material, such as plastic, metal, such as a ferrous, non-ferrous, or stainless metal, carbon, or a combination thereof. The spring 600 may provide a variety of compression forces, such as may be based on the pitch (space between windings of the spring), inner and outer width, spring index, thickness of a winding (i.e. difference between the outer width and the inner width), or other spring parameter.

Figure 7:
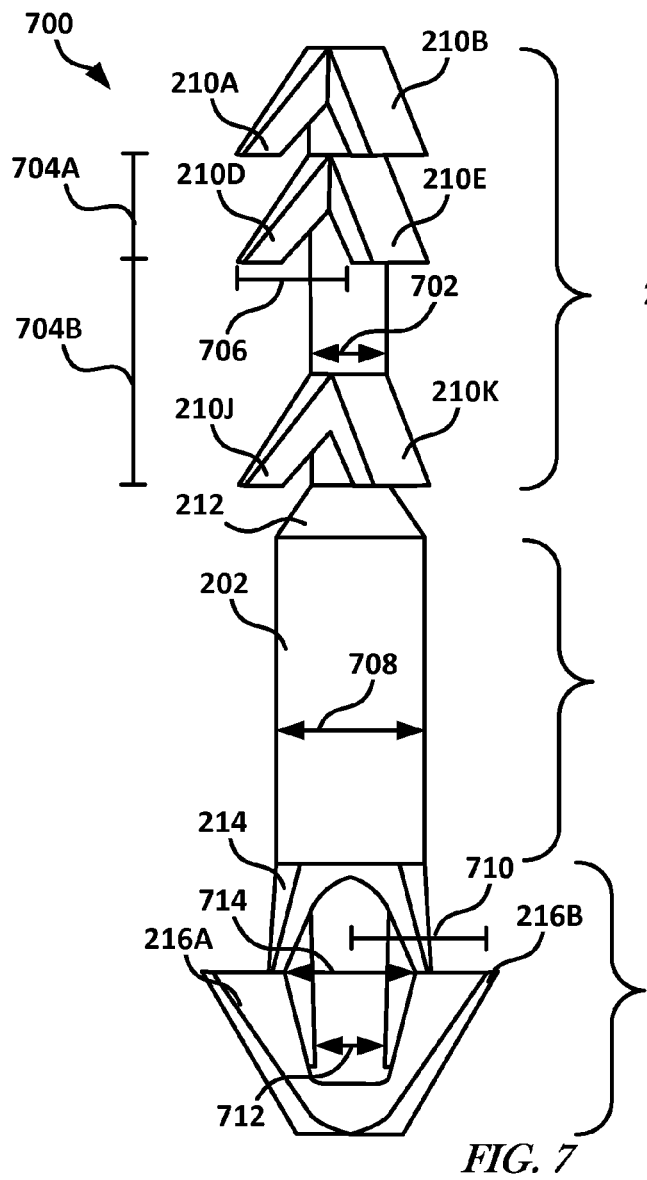
FIG. 7 illustrates, by way of example, a perspective view diagram of another embodiment of an attachment device.

FIG. 7 illustrates, by way of example, a perspective view diagram of an embodiment of an attachment device 700. The device 700 may be similar to the device 200 with the device 700 not including the third group of fastening mechanisms of the device 200. The device 700 may include a shaft 202 with a top portion 304 including a shaft width 702 (e.g., diameter), a fastening mechanism to fastening mechanism length 704A and 704B, and a shaft to fastening mechanism length 706. The shaft to fastening mechanism length 706 may be measured from the center of the shaft 202 to an outer edge of a fastening mechanism 210A-L, such as is shown in FIG. 7.

The central portion 206 of the shaft 202 may include a width 708 (e.g., diameter). The bottom portion 208 of the shaft 202 may include a shaft to fastening mechanism length 710, a shaft width 712 (e.g., diameter), and a fastening mechanism to fastening mechanism width 714 (e.g., a stabilizing structure width, in one or more embodiments).

The inner width 504 of the washer 500 may be greater than the width 702 of the top portion of the shaft 202 and less than the shaft to fastening mechanism length 706 of the top portion of the shaft 202. Such a configuration allows the washer 500 to be pushed over the fastening mechanisms 210A-L while making it difficult to remove the washer 500 after it is situated under a group of the fastening mechanisms (see FIGS. 9A-9D). The outer width 506 of the washer 500 may be greater than the width 708 and greater than the inner width 604 of the spring 600. In one or more embodiments, the outer width 506 of the washer 500 is greater than the outer width 606 of the spring 600. The shaft to fastening mechanism length 706 may be greater than half the width 708 of the central portion 206, such that the outer edge of the fastening mechanisms 210A-L are further from the center of the shaft 202 than the outer edge of the central portion 206 of the shaft 202.

The inner width 604 of the spring 600 may be greater than the shaft to fastening mechanism length 706, less than the outer width 506 of the washer 500, and greater than the width 708 of the central portion 206 of the shaft 202. Such a configuration may allow the spring to be situated between the fastening mechanisms 216A-B and the washer 500.

The fastening mechanism to fastening mechanism length 704A-B is a parameter that is configurable, such as to provide a proper amount of compression force on a spring 600 and a component to be compressed by the spring 600.

The greater the fastening mechanism to fastening mechanism length 704A-B, the bigger the increase in compression force increase in moving the washer 500 between adjacent groups of fastening mechanisms. For example, if a spring 600 is situated between a surface and a washer 500 that is under the first group of fastening mechanisms (the group that includes the fastening mechanisms 210A and 210B) a first amount of compression force is provided on and by the spring 600 (see FIG. 9A). If the washer 500 is moved to be under the second group of fastening mechanisms (the group that includes the fastening mechanisms 210D and 210E) the amount of compression force is increased, and the amount of increase is proportional to the fastening mechanism to fastening mechanism length 704A. Since the length 704B is greater than the length 704A, when the washer 500 is moved under the fourth group of fastening mechanisms (the group of fastening mechanisms that includes the fastening mechanisms 210J and 210K), the amount of compression force is increased more than it is increased when the washer 500 is moved from under the first group of fastening mechanisms to being under the second group of fastening mechanisms. Thus, by decreasing the length between groups of fastening mechanisms, a finer compression force granularity may be achieved. The fastening mechanism to fastening mechanism length 704A-B may be generally constant or varied between adjacent groups of fastening mechanisms. FIG. 7 shows an embodiment that includes a variable fastening mechanism to fastening mechanism length 704A-B, while the FIGS. 2, 3, and 9A-9D show a generally constant fastening mechanism to fastening mechanism length.

Figure 8:
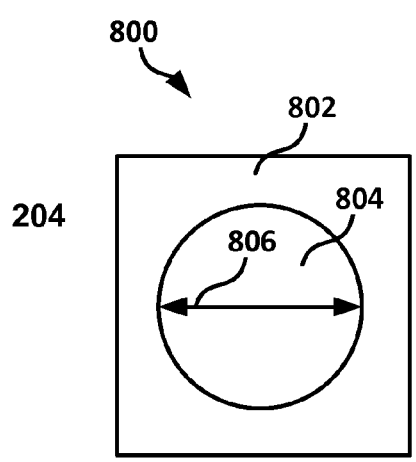
FIG. 8 illustrates, by way of example, a perspective view diagram of an embodiment of a hole in a structure.

FIG. 8 illustrates, by way of example, a diagram of an embodiment of a component 800. The component 800 may include a body portion 802 and a void 804 in the body portion 802. The void 804 may include a width 806 (e.g., radius). While the void 804 is shown as circular in FIG. 8, this not a requirement; the void 804 may be rectangular, another polygonal shape, elliptical, slotted such as to provide a locking mechanism that locks the shaft into place when inserted appropriately into the void 804, or a combination thereof. The void width 806 may be greater than the fastening mechanism to fastening mechanism width 714 and less than two times the shaft to fastening mechanism length 710. Such a configuration may allow the component 800 to be situated around the shaft 202 between the fastening mechanisms 216A-B and the spring 600. In one or more embodiments, the inner width 604 of the spring 600 may be greater than one half the width 806 of the component 800. Note that a board or other structure 902 on which the component is to be situated may include a void with a similar width as the void 804. The board or other structure 902 is shown in FIGS. 9A-9D.

FIGS. 9A, 9B, 9C, and 9D illustrate, by way of example, an embodiment of an attachment device 900A, 900B, 900C, and 900D, respectively, under different operating conditions. FIGS. 9A-9D demonstrate generally how one or more attachment devices discussed herein may be used to provide a range of compression forces, such as to provide a versatile attachment device that may be used to satisfy a range of design requirements.

Figure 9A:
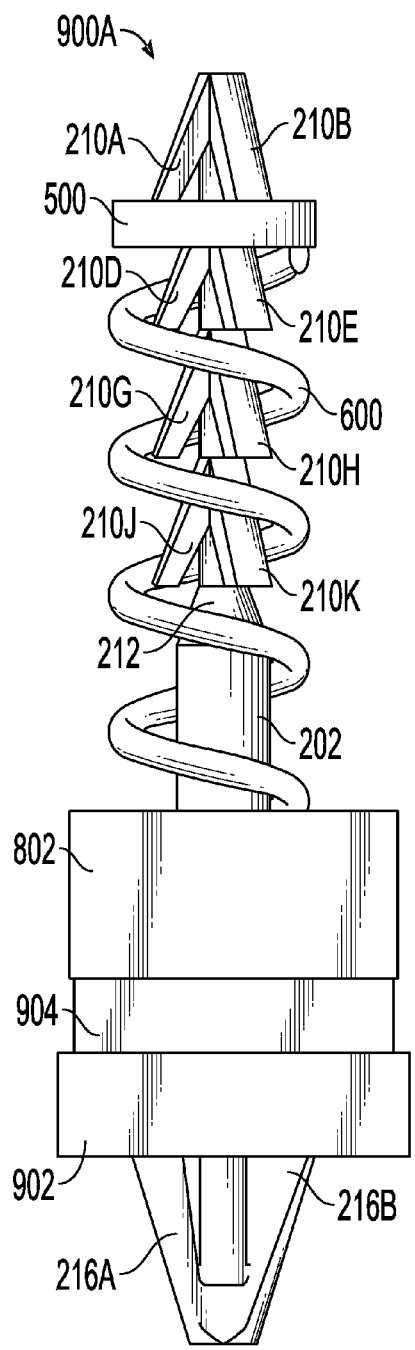
FIGS. 9A, 9B, 9C, and 9D illustrate, by way of example, perspective view diagrams of embodiments of a washer, spring, and device connected to a component and a board.

FIG. 9A shows the attachment device 900A with the washer 500 situated between the first group of fastening mechanisms and the second group of fastening mechanisms. The spring 600 may be situated between the washer 500 and the component 800. The component 800 may be situated over a structure 902. Another component 904 may be situated between the structure 902 and the component 800. The spring 600 may be compressed between the washer 500 and the component 800. The spring 600 may provide a compression force that presses the component 800, the component 904, and the structure 902 towards the fastening mechanisms 216A-B.

Figure 9B:
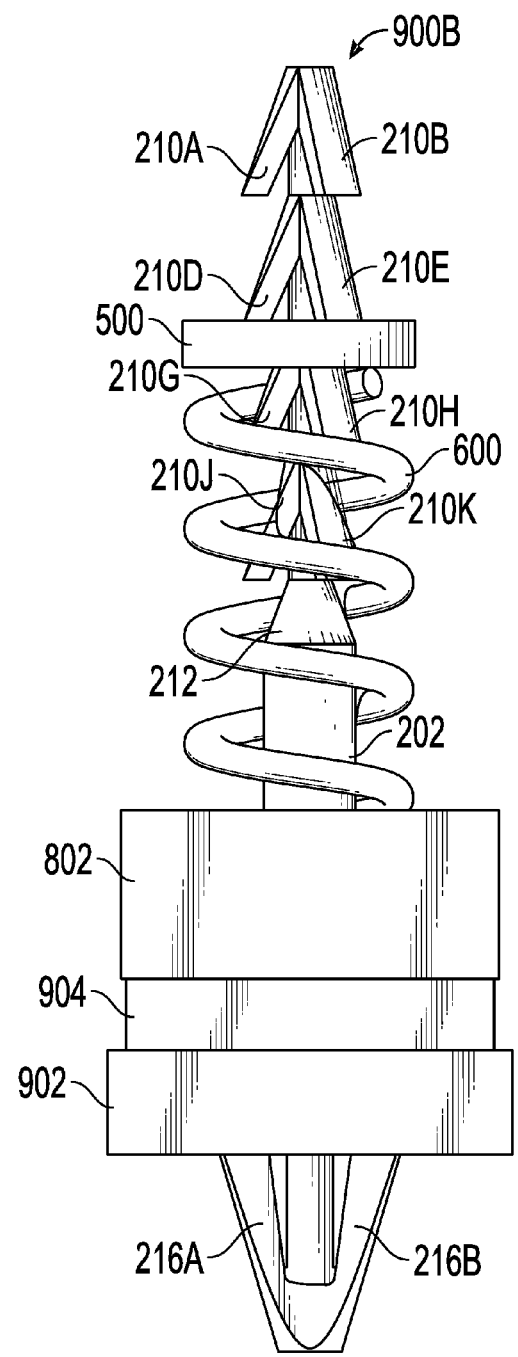
Figure 9C:
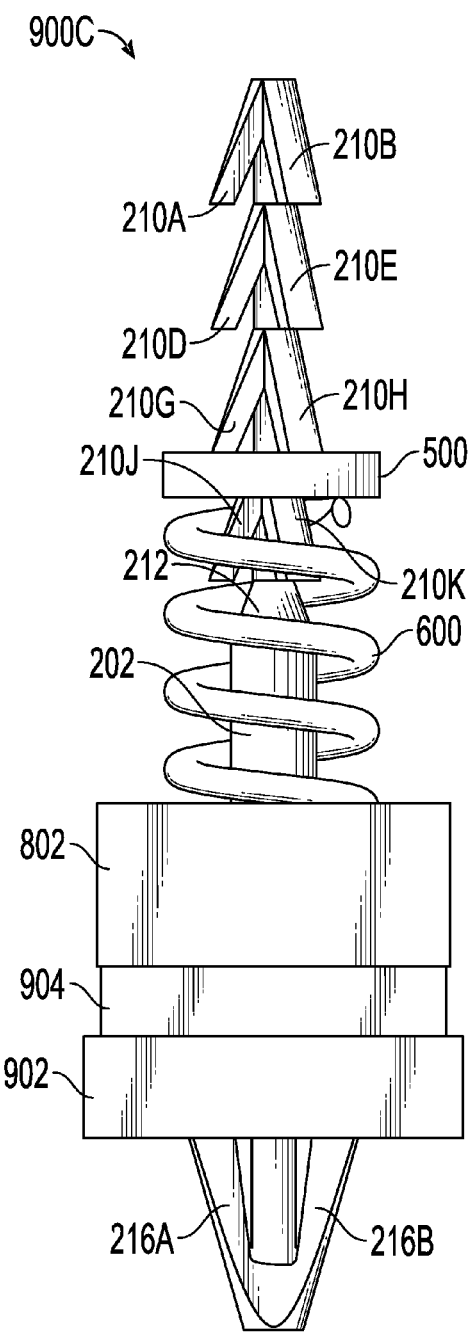
Figure 9D:
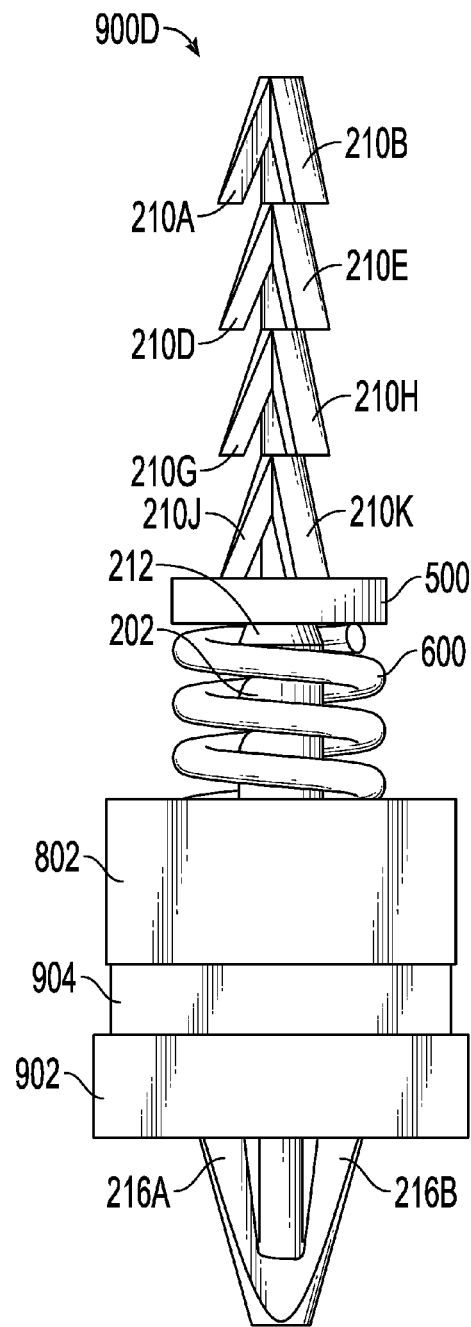

FIG. 9B shows the device 900B in use in a manner similar to the device 900A with the washer 500 situated between the second and third group of fastening mechanisms in FIG. 9B, thus providing an increased compression on the spring 600 and an increased force on the component 800, component 904, and the structure 902, as compared to that of FIG. 9A. FIG. 9C shows the device 900C in use in a manner similar to the device 900A and 900B with the washer 500 situated between the third and fourth group of fastening mechanisms in FIG. 9C, thus providing an increased compression on the spring 600 and an increased resultant force on the component 800, component 904, and the structure 902 as compared to that of FIGS. 9A and 9B. FIG. 9D shows the device 900D in use in a manner similar to the device 900A, 900B, and 900C with the washer 500 situated between the fourth group of fastening mechanisms and the frustum 212 in FIG. 9D, thus providing an increased compression on the spring 600 and an increased resultant force on the component 800, component 904, and the structure 902 as compared to that of FIGS. 9A, 9B, and 9C.

Figure 10:
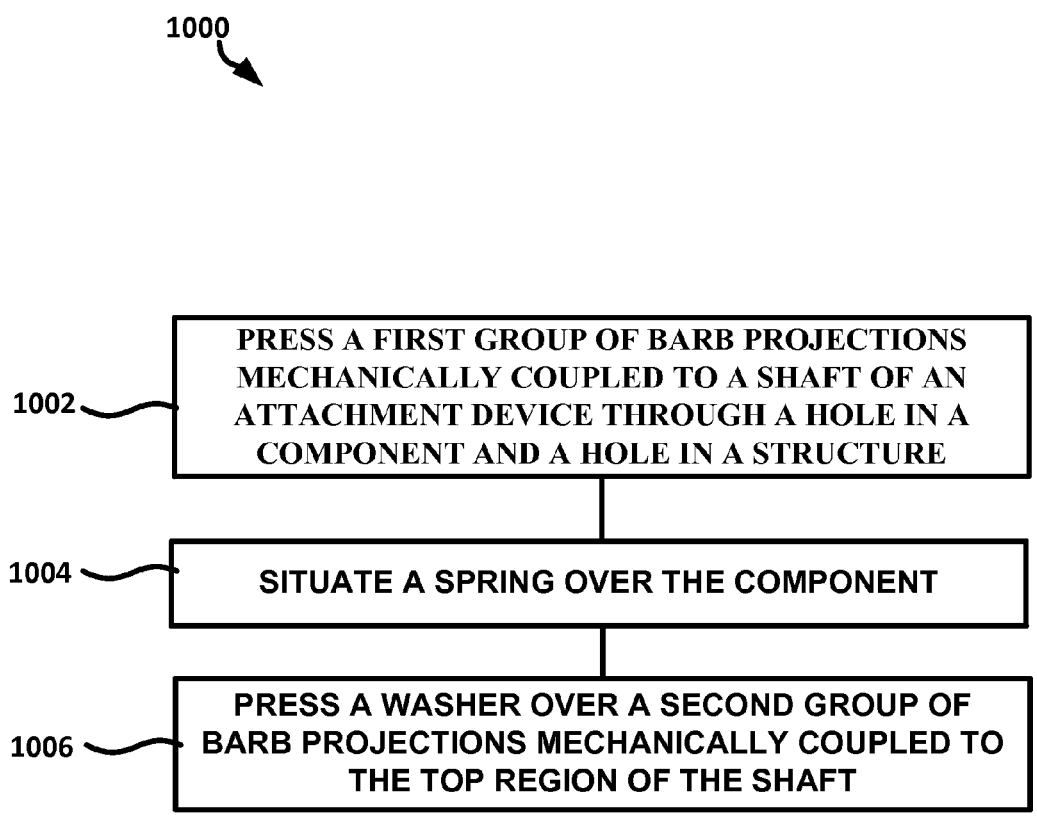
FIG. 10 illustrates, by way of example, an embodiment of a method.

FIG. 10 illustrates, by way of example, a flow diagram of an embodiment of a method 1000, in accord with one or more embodiments. The method 1000 as illustrated includes: pressing a first group of fastening mechanisms mechanically coupled to a shaft of an attachment device through a hole in a component and a hole in a structure, at operation 1002; situating a spring on the component, at operation 1004; press a washer over a second group of fastening mechanisms mechanically coupled to the top portion of the shaft, at operation 1006.

The shaft may include a top portion, a central portion, and a bottom portion. The central portion may be between the top portion and the bottom portion. The first group of fastening mechanisms may be mechanically coupled to the bottom portion of the shaft. Each fastening mechanism of the first group of fastening mechanisms may be angled away from the shaft from the bottom portion of the shaft towards the central portion of the shaft. The operation at 1006 may include pressing the washer over the second group of fastening mechanisms so as to provide a compression force on the spring and provide a corresponding force on the component. Each fastening mechanism of the second group of fastening mechanisms may be angled away from the shaft from the top portion of the shaft towards the central portion of the shaft.

The method 1000 may include pressing the washer over a third group of fastening mechanisms mechanically coupled to the top portion of the shaft. The third group of fastening mechanisms may be closer to the central portion of the shaft than the second group of fastening mechanisms. Each fastening mechanism of the third group of fastening mechanisms may be angled away from the shaft from the top portion of the shaft towards the central portion of the shaft.

The method 1000 may include pressing the washer over a fourth group of fastening mechanisms mechanically coupled to the top portion of the shaft. The fourth group of fastening mechanisms may be closer to the central portion of the shaft than the third group of fastening mechanisms. Each fastening mechanism of the fourth group of fastening mechanisms may be angled away from the shaft from the top portion of the shaft towards the central portion of the shaft.

The method 1000 may include pressing a washer over a fifth group of fastening mechanisms mechanically coupled to the top portion of the shaft. The fifth group of fastening mechanisms may be mechanically coupled to the top portion of the shaft. The fifth group of fastening mechanisms may be closer to the central portion of the shaft than the fourth group of fastening mechanisms. Each fastening mechanism of the fifth group of fastening mechanisms may be angled away from the shaft from the top portion of the shaft towards the central portion of the shaft.

EXAMPLES AND NOTES

The present subject matter may be described by way of several examples.

Example 1 may include or use subject matter (such as an apparatus, a method, a means for performing acts, or a device readable memory including instructions that, when performed by the device, may cause the device to perform acts), such as may include or use an elongated shaft including a top portion, a central portion, and a bottom portion, the central portion between the top portion and the bottom portion, a first fastener in the bottom portion of the shaft, a second fastener in the top portion of the shaft, the second fastener having an adjustable fastening location along the top portion of the shaft, and a spring situated between the first fastener and the second fastener such that a spring force of the spring varies depending on a selected fastening location of the second fastener.

Example 2 may include or use, or may optionally be combined with the subject matter of Example 1 to include or use, wherein the first fastener comprises a first group of barb projections, each barb projection of the first group of barb projections angled away from the shaft from the bottom portion of the shaft towards the central portion of the shaft.

Example 3 may include or use, or may optionally be combined with the subject matter of Example 1 to include or use, wherein the second fastener comprises a second group of barb projections in the top portion of the shaft, each barb projection of the second group of barb projections angled away from the shaft from the top portion of the shaft towards the central portion of the shaft, and a third group of barb projections in the top portion of the shaft and closer to the central portion of the shaft than the second group of barb projections, each barb projection of the third group of barb projections angled away from the shaft from the top portion of the shaft towards the central portion of the shaft.

Example 4 may include or use, or may optionally be combined with the subject matter of Example 3 to include or use, wherein the second fastener further comprises a fourth group of barb projections in the top portion of the shaft and closer to the central portion of the shaft than the third group of barb projections, each barb projection of the fourth group of barb projections angled away from the shaft from the top portion of the shaft towards the central portion of the shaft.

Example 5 may include or use, or may optionally be combined with the subject matter of Example 3 to include or use, a washer with an inner radius greater than a width of the shaft and less than a distance between the center of the shaft and an outer edge of a projection of the second group of barb projections, the washer situated between at least one of (1) the second group of barb projections and the third group of barb projections and (2) the third group of barb projections and the central portion of the shaft.

Example 6 may include or use, or may optionally be combined with the subject matter of at least one of Examples 1-5 to include or use, wherein the top portion of the shaft includes a first width and the central portion of the shaft includes a second width greater than the first width.

Example 7 may include or use, or may optionally be combined with the subject matter of at least one of Examples 1-6 to include or use, wherein the bottom portion includes a stabilizing structure mechanically coupled between the first fastener and the central portion of the shaft, the stabilizing structure allowing the first fastener to flex towards the shaft and resisting the first fastener flexing away from the shaft.

Example 8 may include or use, or may optionally be combined with the subject matter of Example 7 to include or use wherein the stabilizing structure includes an arch opening towards the first fastener.

Example 9 may include or use, or may optionally be combined with the subject matter of at least one of Examples 1-8 to include or use, wherein a width of the bottom portion of the shaft is less than a width of the central portion of the shaft.

Example 10 may include or use, or may optionally be combined with the subject matter of at least one of Examples 1-9 to include or use a frustum mechanically coupled to the shaft, the frustum mechanically coupling the top portion of the shaft to the central portion of the shaft.

Example 11 may include or use, or may optionally be combined with the subject matter of at least one of Examples 1-10 to include or use, wherein the second fastener includes two groups of three barb projections.

Example 12 may include or use, or may optionally be combined with the subject matter of at least one of Examples 1-11 to include or use, wherein the first fastener includes two barb projections in a "U" shaped configuration.

Example 13 may include or use, or may optionally be combined with the subject matter of at least one of Examples 1-12 to include or use, wherein the second fastener is removable.

Example 14 may include or use subject matter (such as an apparatus, a method, a means for performing acts, or a device readable memory including instructions that, when performed by the device, may cause the device to perform acts), such as may include or use a rounded shaft including a top portion with a first diameter, a central portion with a second diameter greater than the first diameter and mechanically coupled to the top portion at a first end of the central portion by a frustum, and a bottom portion with a third diameter less than the second diameter and connected to a second end of the central portion, the second end of the central portion opposite the first end of the central portion, a stabilizing structure including a flexible arch with a span greater than the third diameter connected to and opening away from the second end of the central portion, a first group of barb projections mechanically coupled to the stabilizing structure and the bottom portion of the shaft, wherein the first group of barb projections angled away from the bottom portion of the shaft towards the central portion of the shaft, a second group of barb projections mechanically coupled to the top portion of the shaft, the second group of barb projections angled away from the shaft from the top portion of the shaft towards the central portion of the shaft, and a third group of barb projections mechanically coupled to the top portion of the shaft, the third group of barb projections closer to the central portion of the shaft than the second group of barb projections and angled away from the shaft from the top portion of the shaft towards the central portion of the shaft.

Example 15 may include or use, or may optionally be combined with the subject matter of Example 14 to include or use a washer including an inner diameter greater than the first diameter, the washer situated between at least one of (1) the second group of barb projections and the third group of barb projections and (2) the third group of barb projections and the central portion of the shaft.

Example 16 may include or use, or may optionally be combined with the subject matter of Example 15 to include or use a spring between the washer and the first group of barb projections and including a diameter greater than an inner diameter of the washer and less than an outer diameter of the washer.

Example 17 may include or use, or may optionally be combined with the subject matter of at least one of Examples 14-16 to include or use a fourth group of barb projections mechanically coupled to the top portion of the shaft, the fourth group of barb projections closer to the central portion of the shaft than the third group of barb projections and angled away from the shaft from the top portion of the shaft towards the central portion of the shaft.

Example 18 may include or use, or may optionally be combined with the subject matter of Example 17 to include or use a fifth group of barb projections mechanically coupled to the top portion of the shaft, the fifth group of barb projections closer to the central portion of the shaft than the fourth group of barb projections and angled away from the shaft from the top portion of the shaft towards the central portion of the shaft.

Example 19 may include or use subject matter (such as an apparatus, a method, a means for performing acts, or a device readable memory including instructions that, when performed by the device, may cause the device to perform acts), such as may include or use pressing a first group of barb projections mechanically coupled to a shaft of an attachment device through a hole in a component and a hole in a structure, wherein the shaft includes a top portion, a central portion, and a bottom portion, the central portion between the top portion and the bottom portion, the first group of barb projections mechanically coupled to the bottom portion of the shaft, and each barb projection of the first group of barb projections angled away from the shaft from the bottom portion of the shaft towards the central portion of the shaft, situating a spring over the component, and pressing a washer over a second group of barb projections mechanically coupled to the top portion of the shaft so as to provide a compression force on the spring and provide a corresponding force on the component, wherein each barb projection of the second group of barb projections is angled away from the shaft from the top portion of the shaft towards the central portion of the shaft.

Example 20 may include or use, or may optionally be combined with the subject matter of Example 19 to include or use pressing the washer over a third group of barb projections mechanically coupled to the top portion of the shaft, the third group of barb projections closer to the central portion of the shaft than the second group of barb projections and each barb projection of the third group of barb projections angled away from the shaft from the top portion of the shaft towards the central portion of the shaft.

Example 21 may include or use, or may optionally be combined with the subject matter of at least one of Examples 19-20 to include or use means for performing any of the methods of Example 19-20.

The above detailed description includes references to the accompanying drawings, which form a part of the detailed description. The drawings show, by way of illustration, specific embodiments in which methods, apparatuses, and systems discussed herein may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, a "-" (dash) used when referring to a reference number means "or", in the non-exclusive sense discussed in the previous paragraph, of all elements within the range indicated by the dash. For example, 103A-B means a nonexclusive "or" of the elements in the range {103A, 103B}, such that 103A-103B includes "103A but not 103B", "103B but not 103A", and "103A and 103B".

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A device comprising:
    an elongated shaft including a top portion, a central portion, and a bottom portion, the central portion between the top portion and the bottom portion;
    a first fastener in the bottom portion of the shaft, wherein the first fastener comprises a first group of barb projections, each barb projection of the first group of barb projections angled away from the shaft from the bottom portion of the shaft towards the central portion of the shaft;

a second fastener in the top portion of the shaft, the second fastener having an adjustable fastening location along the top portion of the shaft; and a spring situated between the first fastener and the second fastener such that a spring force of the spring varies depending on a selected fastening location on the second fastener.

2. The device of claim 1, wherein the second fastener comprises:

a second group of barb projections in the top portion of the shaft, each barb projection of the second group of barb projections angled away from the shaft from the top portion of the shaft towards the central portion of the shaft; and a third group of barb projections in the top portion of the shaft and closer to the central portion of the shaft than the second group of barb projections, each barb projection of the third group of barb projections angled away from the shaft from the top portion of the shaft towards the central portion of the shaft.

3. The device of claim 2, wherein the second fastener further comprises a fourth group of barb projections in the top portion of the shaft and closer to the central portion of the shaft than the third group of barb projections, each barb projection of the fourth group of barb projections angled away from the shaft from the top portion of the shaft towards the central portion of the shaft.

4. The device of claim 2, further comprising a washer with an inner radius greater than a width of the shaft and less than a distance between the center of the shaft and an outer edge of a projection of the second group of barb projections, the washer situated between at least one of (1) the second group of barb projections and the third group of barb projections and (2) the third group of barb projections and the central portion of the shaft.

5. The device of claim 1, wherein the top portion of the shaft includes a first width and the central portion of the shaft includes a second width greater than the first width.

6. The device of claim 1, wherein the bottom portion includes a stabilizing structure mechanically coupled between the first fastener and the central portion of the shaft, the stabilizing structure allowing the first fastener to flex towards the shaft and resisting the first fastener flexing away from the shaft.

7. The device of claim 6, wherein the stabilizing structure includes an arch opening towards the first fastener.

8. The device of claim 1, wherein a width of the bottom portion of the shaft is less than a width of the central portion of the shaft.

9. The device of claim 1, further comprising a frustum mechanically coupled to the shaft, the frustum mechanically coupling the top portion of the shaft to the central portion of the shaft.

10. The device of claim 1, wherein the first fastener includes two groups of three barb projections.

11. The device of claim 1, wherein the first fastener includes a group of two barb projections in a "U" shaped configuration.

12. The device of claim 1, wherein the second fastener is removable.

13. A device comprising:

a rounded shaft including a top portion with a first diameter, a central portion with a second diameter greater than the first diameter and mechanically coupled to the top portion at a first end of the central portion by a frustum, and a bottom portion with a third diameter less than the second diameter and connected to a second end of the central portion, the second end of the central portion opposite the first end of the central portion;

a stabilizing structure including a flexible arch with a span greater than the third diameter connected to and opening away from the second end of the central portion;

a first group of barb projections mechanically coupled to the stabilizing structure and the bottom portion of the shaft, wherein the first group of barb projections angled away from the bottom portion of the shaft towards the central portion of the shaft;

a second group of barb projections mechanically coupled to the top portion of the shaft, the second group of barb projections angled away from the shaft from the top portion of the shaft towards the central portion of the shaft; and a third group of barb projections mechanically coupled to the top portion of the shaft, the third group of barb projections closer to the central portion of the shaft than the second group of barb projections and angled away from the shaft from the top portion of the shaft towards the central portion of the shaft.

14. The device of claim 13, further comprising a washer including an inner diameter greater than the first diameter, the washer situated between at least one of (1) the second group of barb projections and the third group of barb projections and (2) the third group of barb projections and the central portion of the shaft.

15. The device of claim 14, further comprising a spring between the washer and the first group of barb projections and including a diameter greater than an inner diameter of the washer and less than an outer diameter of the washer.

16. The device of claim 15, further comprising a fourth group of barb projections mechanically coupled to the top portion of the shaft, the fourth group of barb projections closer to the central portion of the shaft than the third group of barb projections and angled away from the shaft from the top portion of the shaft towards the central portion of the shaft.

17. The device of claim 16, further comprising a fifth group of barb projections mechanically coupled to the top portion of the shaft, the fifth group of barb projections closer to the central portion of the shaft than the fourth group of barb projections and angled away from the shaft from the top portion of the shaft towards the central portion of the shaft.

18. A method comprising:

pressing a first group of barb projections mechanically coupled to a shaft of an attachment device through a hole in a component and a hole in a structure, wherein the shaft includes a top portion, a central portion, and a bottom portion, the central portion between the top portion and the bottom portion, the first group of barb projections mechanically coupled to the bottom portion of the shaft, and each barb projection of the first group of barb projections angled away from the shaft from the bottom portion of the shaft towards the central portion of the shaft;

situating a spring over the component; and pressing a washer over a second group of barb projections mechanically coupled to the top portion of the shaft so as to provide a compression force on the spring and provide a corresponding force on the component, wherein each barb projection of the second group of barb projections is angled away from the shaft from the top portion of the shaft towards the central portion of the shaft.

19. The method of claim 18, further comprising pressing the washer over a third group of barb projections mechanically coupled to the top portion of the shaft, the third group of barb projections closer to the central portion of the shaft than the second group of barb projections and each barb projection of the third group of barb projections angled away from the shaft from the top portion of the shaft towards the central portion of the shaft.

* * * * *